United States Patent
Searls et al.

(10) Patent No.: US 6,672,370 B2
(45) Date of Patent: *Jan. 6, 2004

(54) APPARATUS AND METHOD FOR PASSIVE PHASE CHANGE THERMAL MANAGEMENT

(75) Inventors: Damion T. Searls, Portland, OR (US); Terrance J. Dishongh, Hillsboro, OR (US); David Pullen, Portland, OR (US)

(73) Assignee: Intel Corporation, Santa Clara, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/525,173

(22) Filed: Mar. 14, 2000

(65) Prior Publication Data

US 2002/0104641 A1 Aug. 8, 2002

(51) Int. Cl.[7] ............................ F28D 19/00; F28D 15/00
(52) U.S. Cl. ................ 165/10; 165/104.14; 165/104.33
(58) Field of Search ................................ 165/10, 104.14, 165/185, 104.33; 361/698, 700; 257/713

(56) References Cited

U.S. PATENT DOCUMENTS

| | | | | |
|---|---|---|---|---|
| 3,884,295 A | * | 5/1975 | Laing et al. ............... | 165/10 |
| 4,237,023 A | * | 12/1980 | Johnson et al. ............ | 252/70 |
| 4,602,314 A | | 7/1986 | Broadbent ................. | 361/386 |
| 4,923,077 A | * | 5/1990 | Van Iperen et al. ........ | 206/527 |
| 4,982,722 A | * | 1/1991 | Wyatt ...................... | 126/400 |
| 5,007,478 A | * | 4/1991 | Sengupta .................. | 165/10 |
| 5,315,154 A | * | 5/1994 | Elwell ..................... | 257/707 |
| 5,370,814 A | * | 12/1994 | Salyer ..................... | 252/70 |
| 5,508,884 A | * | 4/1996 | Brunet et al. .............. | 361/700 |
| 5,709,914 A | * | 1/1998 | Hayes ..................... | 428/35.1 |
| 5,722,482 A | | 3/1998 | Buckley ................... | 165/10 |
| 5,895,972 A | | 4/1999 | Paniccia ................... | 257/706 |
| 5,924,482 A | | 7/1999 | Edwards et al. ........ | 165/104.33 |
| 5,926,367 A | | 7/1999 | Gutierrez et al. .......... | 361/695 |
| 5,940,271 A | * | 8/1999 | Mertol .................... | 165/80.3 |
| 5,945,217 A | * | 8/1999 | Hanrahan ................. | 428/389 |
| 5,986,884 A | * | 11/1999 | Jairazbhoy et al. ........ | 361/700 |
| 6,079,404 A | * | 6/2000 | Salyer .................. | 126/263.03 |
| 6,083,417 A | * | 7/2000 | Gomi et al. ................ | 252/70 |
| 6,181,558 B1 | * | 1/2001 | Gordon .................... | 361/700 |
| 6,202,739 B1 | * | 3/2001 | Pal et al. ............... | 165/104.33 |
| 6,227,285 B1 | * | 5/2001 | Hildebrand et al. ......... | 165/10 |
| 6,395,991 B1 | * | 5/2002 | Dockerty et al. ........... | 174/252 |

FOREIGN PATENT DOCUMENTS

| | | | | |
|---|---|---|---|---|
| JP | 01298753 | 12/1989 | .......... | H01L/23/42 |
| JP | 05218250 | 8/1993 | .......... | H01L/23/42 |

* cited by examiner

*Primary Examiner*—Henry Bennett
*Assistant Examiner*—Tho V Doung
(74) *Attorney, Agent, or Firm*—Schwegman, Lundberg, Woessner & Kluth, P.A.

(57) ABSTRACT

A heat sink includes a heat sink body including a number of fins and a cavity for holding a phase change material and a number of particles to enhance the mixing of the phase change material during the operation of the heat sink. In operation, the body of the heat sink conducts thermal energy to the phase change material. The energy is absorbed during the phase change of the phase change material. After absorbing energy and changing to a liquid state, the phase change material continues to dissipate energy by convection. The convection currents in the cavity are directed by the shape of the cavity surfaces and enhanced by the particles intermixed with the phase change material.

9 Claims, 3 Drawing Sheets

APPARATUS AND METHOD FOR PASSIVE PHASE CHANGE THERMAL MANAGEMENT

FIELD

This invention relates to removing heat from a system, and more particularly to removing heat from an integrated circuit die.

BACKGROUND

An integrated circuit, such as a processor circuit, produces heat in a circuit die or substrate. Failure to efficiently remove the heat from the die results in failure of the circuit. One method of removing heat from a die includes thermally coupling a finned heat sink to the die and forcing air across the fins using a fan. Unfortunately, forced air cooling is not practical for cooling integrated circuits in hand held communication devices or in personal digital assistants. In addition, forced air cooling has a number of significant disadvantages, even when used in cooling systems, such as servers and engineering workstations, that have traditionally used forced air cooling.

One disadvantage associated with forced air cooling is that it is expensive. Customers who purchase systems composed of integrated circuits, such as computers, are interested in reducing the operating costs of those systems. A fan moves air by driving a fan blade with a motor. The motor requires energy to operate. Using a fan to provide forced air cooling in these systems increases the operating costs of the systems.

As the circuit density on a die increases, more heat is produced on the die and the die needs to be cooled quickly to avoid circuit failure. To cool the die quickly, the rate at which air is forced across the heat sink is increased. Increasing the rate at which air is forced across the heat sink generally requires a fan having a larger blade and a larger motor. The larger motor consumes more power and increases the system operating costs.

Another significant disadvantage associated with forced air cooling is that it is not effective for cooling hot spots on a substrate. Heat is not generated uniformly over the surface of an integrated circuit substrate. This uneven generation of heat produces hot spots in the substrate. In some systems, hot spots may be cooled sufficiently to prevent immediate catastrophic failure of the circuit using forced air cooling, but over time, failure to adequately cool hot spots leads to premature failure of the circuits fabricated near the hot spots.

For these and other reasons there is a need for the present invention.

DESCRIPTION

Figure 1B:
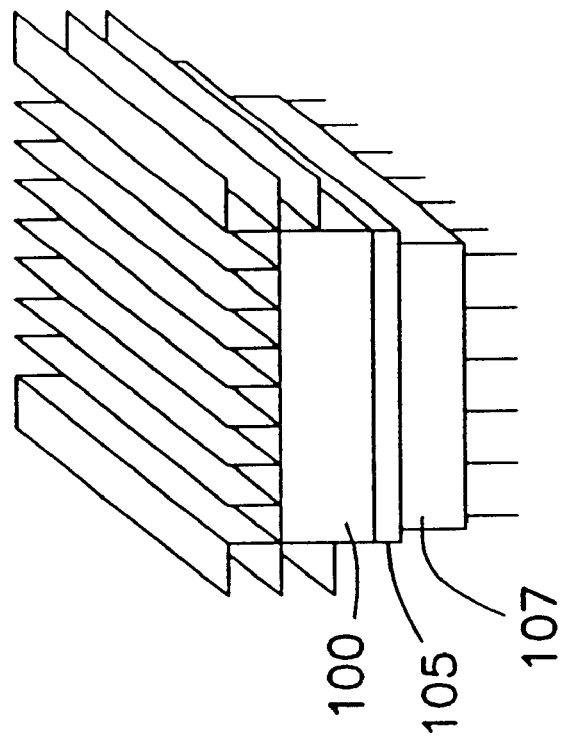
FIG. 1B is a perspective view of example embodiments of the present invention showing a heat sink thermally coupled to an integrated circuit package.

In the following detailed description of the invention reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

A heat sink and a method of fabricating and using the heat sink are described herein. The heat sink is thermally coupled to an integrated circuit die and dissipates heat produced in the integrated circuit die. The heat sink includes a cavity containing a phase change material and a number of particles for enhancing convection in the heat sink during the cooling of an integrated circuit die. The heat sink is highly reliable and exhibits enhanced cooling characteristics when compared with a traditional finned heat sink. Efficient manufacturing of the heat sink is achieved by a symmetrical arrangement of the heat sink structures.

Figure 1A:
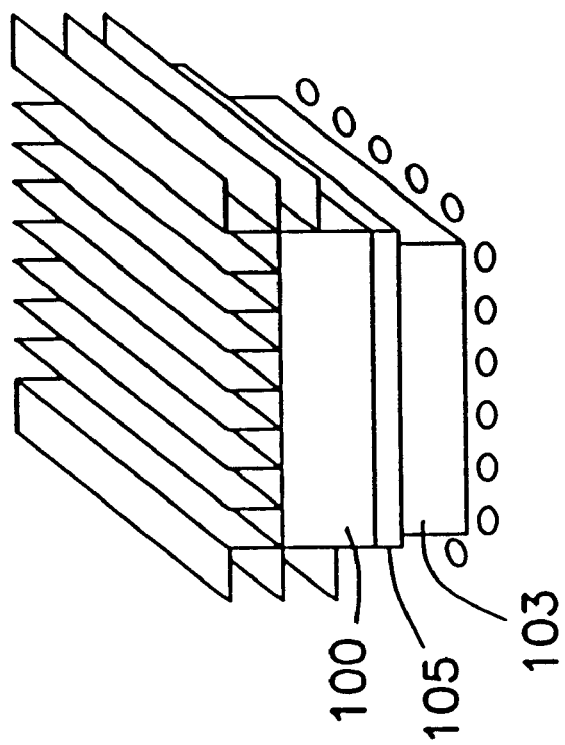
FIG. 1A is a perspective view of example embodiments of the present invention showing a heat sink thermally coupled to an integrated circuit.

FIG. 1A is a perspective view of example embodiments of the present invention showing heat sink 100 thermally coupled to integrated circuit die 103. Heat sink 100 is not limited to operation in connection with a particular type of integrated circuit fabricated on die 103. Digital circuits, such as processors, digital signal processors, and communication circuits are all suitable for use in connection with heat sink 100. Similarly, analog circuits, such as amplifiers, power amplifiers, radio-frequency amplifiers, phase-locked loops, and frequency filters are also suitable for use in connection with heat sink 100. Thermally conductive layer 105 is formed on die 103 and fabricated from a thermally conductive gel, paste, tape or other thermally conductive material. When heat sink 100 is affixed to thermally conductive layer 105, thermally conductive layer 105 provides a thermal path to heat sink 100 from integrated circuit die 103. In operation, heat sink 100 dissipates heat produced in integrated circuit die 103.

Example embodiments of the present invention, as described above, are effective in dissipating heat from an integrated circuit directly coupled to heat sink 100. However, the present invention is not limited to such embodiments. The present invention is also effective in dissipating heat from a packaged die. FIG. 1B is a perspective view of example embodiments of the present invention showing heat sink 100 thermally coupled to integrated circuit package 107. Heat sink 100 is coupled to package 107 by the same process used to couple heat sink 100 directly to integrated circuit die 103 shown in FIG. 1A. Thermally conductive layer 105 is formed on package 107 and heat sink 100 is affixed to thermally conductive layer 105. The heat flow from packaged integrated circuit die 103 is coupled to package 107 by the ambient air surrounding die 103 in package 107 or is directly coupled to package 107 by a heat spreader. Heat sink 100 includes a number of structures and materials that participate in the dissipation of the heat produced by integrated circuit die 103. These structures and materials are described in more detail below.

Figure 2:
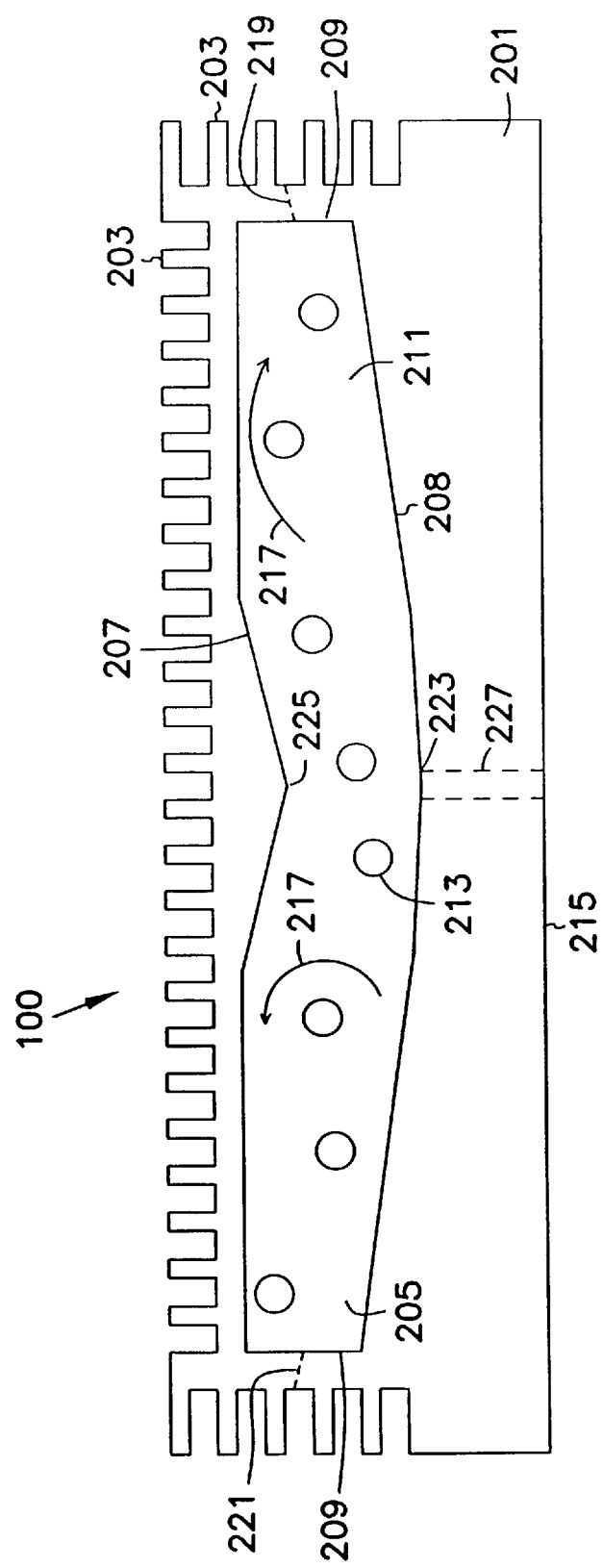
FIG. 2 is a cross-sectional side view of example embodiments of the heat sink of the present invention.

FIG. 2 is a cross-sectional side view of example embodiments of heat sink 100. Heat sink 100 comprises body 201 including a number of fins 203 and cavity 205 including cavity surfaces 207–209, phase change material 211 encapsulated in cavity 205, and a number of particles 213 intermixed with phase change material 211.

Body 201 is fabricated from a thermally conductive material, preferably a metal, such as copper or aluminum or an alloy of copper or aluminum. External surface 215 of body 201 is a substantially flat surface suitable for thermally coupling to a surface of integrated circuit die 103 as shown in FIG. 1A or package 107 shown in FIG. 1B. The flat surface is formed on heat sink 100 by machining or other material shaping-process. External surface 215 has a footprint that is preferably significantly larger than the surface area of integrated circuit die 103 or package 107. The remaining surface area of body 201 preferably provides a large area for transferring heat from body 201 to the surrounding ambient environment. In one embodiment, a number of fins 203 are formed on the remaining surface area of body 201 by machining or other material shaping process. Alternatively, the number of fins 203 are fabricated as a separate unit and attached to the outer surface of heat sink 100 by brazing, soldering or welding. After machining or attachment, fins 203 provide a large surface area for transferring heat to the surrounding ambient environment. The dissipation of heat in phase change material 211 allows the fins 203 of the present invention to have a height that is about 10% to 20% less than the height of fins fabricated on a comparable heat sink intended for use in a forced air cooling system. This creates a lower profile package which is useful in cooling circuits in a variety of devices, such as mobile phones and personal digital assistants. Alternatively, if the height of fins 203 is not reduced, then cooling using heat sink 100 is greater than cooling produced by a standard size package.

Cavity 205 is included in body 201 to hold phase change material 211. Cavity 205 has a volume that is sufficient to allow convection currents 217 to arise in phase change material 211 during the operation of integrated circuit 103. Convection currents 217 assist in cooling integrated circuit die 103. Cavity 205 is positioned in body 201 to enhance the heat transfer from phase change material 211 to the number of fins 203. Thus, cavity 205 is generally centered with respect to the number of fins 203 located on the side surfaces of body 201. The thickness of the wall between cavity surfaces 207 and 209 and the number of fins 203 is preferably made as thin as possible without compromising the structural integrity of heat sink 100.

In one embodiment, body 201 is fabricated from a pair of symmetrical structures. Each structure includes a cavity having a volume equal to one-half of the volume of cavity 205. Coupling the pair of symmetrical structures together forms heat sink 100 including cavity 205 formed in the interior of heat sink 100. Coupling is accomplished by brazing, welding, soldering, or any other suitable metal fusing process.

In an alternate embodiment, a bottom section of body 201 is formed having cavity 205 including cavity surfaces 208 and 209. A top section of body 201 is formed having surface 207. Finally, the top section of body 201 is coupled along the dashed lines 219 and 221 to the bottom section of body 201 to form heat sink 100 including body 201 having cavity 205. Coupling is accomplished by brazing, welding, soldering, or any other suitable metal fusing process.

Cavity surfaces 207–209 are shaped to enhance the formation of convection currents 217 in phase change material 211 during the operation of integrated circuit 103. Cavity surface 208 slopes upward toward cavity surface 209 from low area 223 located near the center of surface 208. Low area 223 is preferably positioned in body 201 such that when body 201 is coupled to integrated circuit die 103, low area 223 is positioned directly above the hot spot of integrated circuit die 103. Such positioning of low area 223 enhances the flow of convection currents 217 in phase change material 211. For most integrated circuits, the hot spot is located approximately in the center of the die. The shape of low area 223 is not limited to a particular shape. In some embodiments, low area 223 is a point or a small flat rectangular area and surface 208 has the shape of a pyramid or a flat top pyramid. In alternate embodiments, low area 223 is an approximately circular area or a point and surface 208 has the shape of a flat top cone or a cone. In still another alternate embodiment, low area 223 is a wedge running the length of cavity 201.

Cavity surface 207 also contributes to enhancing the flow of convection currents 217 in cavity 205. Cavity surface 207 slopes upward toward cavity surface 209 from second low area 225 located near the center of surface 207. Second low area 225 is preferably positioned in body 205 such that when body 205 is coupled to integrated circuit die 103, second low area 225 is positioned directly above the hot spot of integrated circuit die 103. Such positioning of second low area 225 enhances the flow of convection currents 217 in phase change material 211 as described below.

The shape of second low area 225 is not limited to a particular shape. In some embodiments, second low area 225 is a point or a small flat rectangular area and surface 207 has the shape of a pyramid or a flat top pyramid. In alternate embodiments, second low area 225 is an approximately circular area or a point and surface 207 has the shape of a flat top cone or a cone. In still another alternate embodiment, second low area 225 is a wedge running along the length of cavity 205.

Cavity surface 209 forms an outer wall for cavity 205. As convection currents 217 are induced by heating at surface 215 and flow up from low area 223, the convection currents 217 are split at second lower area 225 and routed toward cavity surface 209. Cavity surface 209 directs convection currents 217 down and along surface 208 toward low area 223. In one embodiment, cavity surface 209 comprises a number of substantially flat surfaces. In an alternate embodiment, cavity surface 209 comprises a substantially curved surface.

Phase change material 211 in the solid phase only partially fills cavity 205. The unfilled portion of cavity 205 provides room for expansion of phase change material 211 during the operation of integrated circuit 103. Heat sink 100, including phase change material 211, exhibits superior heat dissipation properties when compared with a heat sink that does not include phase change material 211. Phase change material 211 absorbs heat and provides conductive cooling during the power up cycle of integrated circuit 100. Phase change material 211 is especially effective in cooling local hot spots and thermal transients that occur on die 103 during the power up cycle. In addition, phase change material 211, by circulating in a liquid state, provides convective cooling during the steady state operation of integrated circuit 103. In one embodiment, phase change material 211 comprises TH58. A phase change material designated as TH58 has a melting temperature of about 58 degrees centigrade, an average density of about 1500 $kg/m^3$, and a latent heat of between about 175 kJ/kg and about 225 kJ/kg. Phase change materials suitable for use in connection with the present invention include hydrated salts, eutectic salts and paraffins. Other phase change materials may also be suitable for use in connection with the present invention.

A number of particles 213 are intermixed with phase change material 211. The number of particles 213 enhance fluid mixing during the heating of phase change material 211 without relying on moving parts. By not relying on moving parts, heat sink 100 is highly reliable. Enhancing the fluid mixing inside cavity 205 increases the ability of heat sink 100 to dissipate heat through convection in phase change material 211. Each particle in the number of particles 213 preferably has a density about equal to the density of phase change material 211. Each particle in the number of particles 213 also preferably has an approximately spherical shape. In one embodiment, the number of particles 213 are solid $SiO_2$ spheres. In an alternate embodiment, the number of particles 213 are hollow $SiO_2$ spheres. In still another alternate embodiment, the number of particles 213 are particles of sand. The quantity of particles intermixed with phase change material 211 is selected to be large enough to enhance the convective cooling in phase change material 211, but the number of particles 213 should not be so large as to significantly decrease the conductive cooling provided during a phase change of phase change material 211.

The number of particles 213 also provide a secondary thermal dissipation effect. As the number of particles assist in mixing phase change material 211, they move through areas of cavity 205 having different temperatures. As the number of particles 213 move through areas having a lower temperature, phase change material 211 congeals on the number of particles 213. The congealing of phase change material 211 on the number of particles 213 increases the weight of the particles and causes them to fall to warmer surface 208. After falling to warmer surface 208, the number of particles 213 are recirculated within cavity 205.

Efficient manufacturing of heat sink 100 is achieved by maintaining symmetry in the design of heat sink 100. Symmetry is maintained by arranging the number of fins 203 and cavity 205 symmetrically about a dividing line that separates heat sink 100 into two substantially identical halves. Since the halves are identical, a machining process for cutting the number of fins 203 and cavity 205 is developed for producing only one half. After two halves are fabricated, the halves are joined by a brazing, welding, soldering or other suitable metal fusing process to form body 201. Injection hole 227 is drilled in body 201 and a mixture of phase change material 211 and a number of particles 215 is injected into cavity 205. The injection hole is sealed, and the fabrication of heat sink 100 is complete. The volume of the injected mixture, if injected at a temperature less than the operating temperature of heat sink 100, does not completely fill cavity 205. Some volume in cavity 205 is reserved for expansion of phase change material 211 during the operation of heat sink 100.

Figure 3:
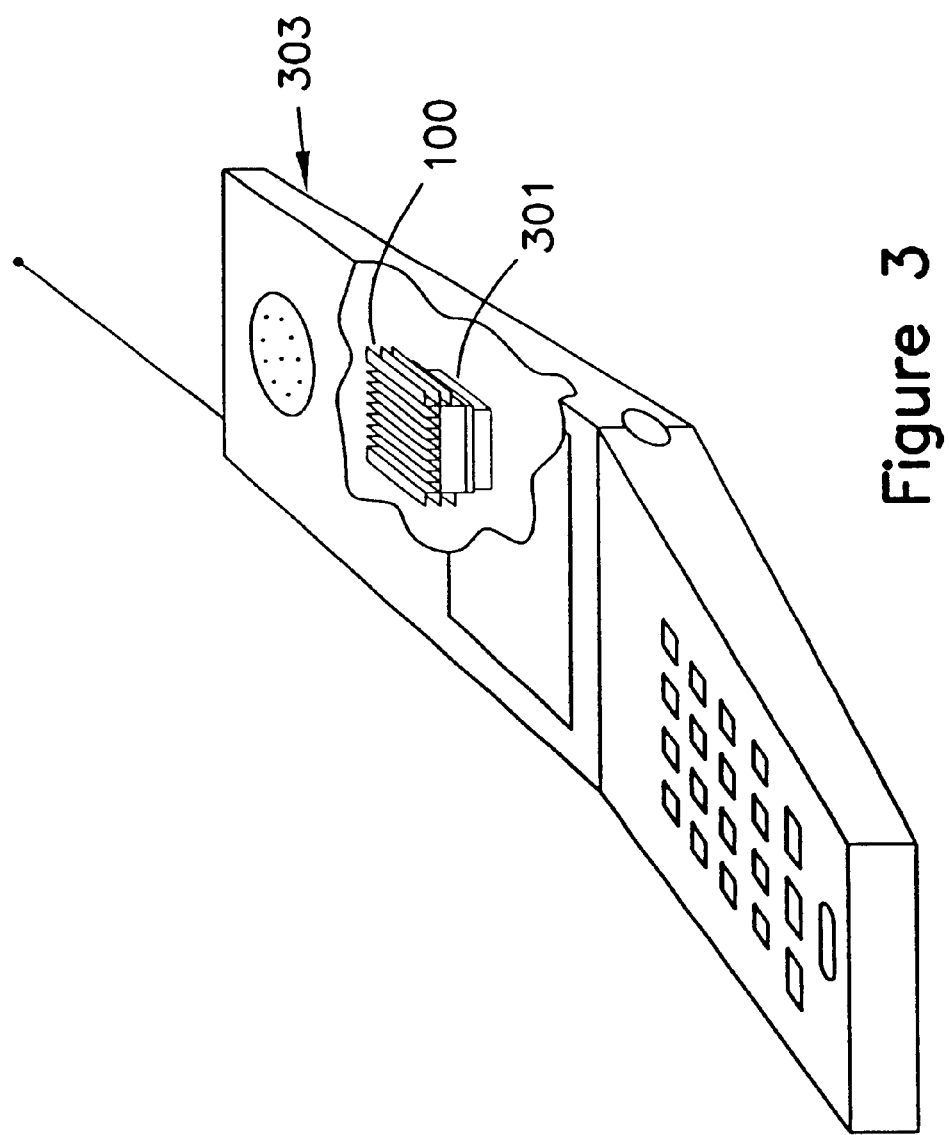
FIG. 3 is a perspective view of example embodiments of the present invention showing a heat sink thermally coupled to an integrated circuit included in a wireless communication device.

FIG. 3 is a perspective view of example embodiments of the present invention showing heat sink 100 thermally coupled to integrated circuit 301 included in wireless communication device 303. In one embodiment, wireless communication device 303 is a cell phone. In an alternate embodiment, wireless communication device 303 is a personal digital assistant. Heat sink 100 is capable of cooling integrated circuit 301 in wireless communication device 303 without forced air. Integrated circuit 301, in one embodiment, is a processor. In an alternate embodiment integrated circuit 301 is a digital signal processor. Portable devices, such as wireless communication device 303 produce a significant amount of thermal energy and heat sink 100 is also capable of dissipating the heat without increasing the height of the heat sink, which permits wireless communication device 303 to have a low profile package.

Heat sink 100 is not limited to use in connection with wireless devices. Since heat sink 100 is more efficient at dissipating thermal energy than a standard heat sink, heat sink 100 is especially useful for dissipating thermal energy in integrated circuits used in computing devices, such as laptop computers, servers, and engineering workstations, that generate a large amount of thermal energy.

A heat sink and a method for fabricating and using the heat sink has been described. The heat sink is thermally coupled to an integrated circuit die. The heat sink includes a cavity containing a phase change material and a number of particles for enhancing convection in the heat sink during the cooling of the integrated circuit die. The heat sink is highly reliable and exhibits enhanced cooling characteristics when compared to a heat sink that does not include a cavity containing a phase change material and a number of particles.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is intended that this invention be limited only by the claims and the equivalents thereof.

What is claimed is:

1. An apparatus comprising:
    a phase change material;
    a plurality of particles intermixed with the phase change material; and
    a conductive structure encapsulating the phase change material and the plurality of particles, the conductive structure including a cavity having a first sloping surface, wherein the first sloping surface slopes upward from a first low area positioned above a hot spot of an integrated circuit die.

2. The apparatus of claim 1, wherein the conductive structure further comprises:
    a second sloping surface, wherein the second sloping surface slopes upward from a second low area positioned above the hot spot of an integrated circuit die.

3. The apparatus of claim 2, wherein the second sloping surface is shaped to split convection currents included in the phase change material.

4. The apparatus of claim 1, wherein the cavity has a cavity surface including a plurality of structures.

5. The apparatus of claim 1, wherein at least one of the plurality of particles comprises SiO2.

6. The apparatus of claiom 1, wherein the phase change material congeals on the plurality of particles in cooler regions of the phase change material.

7. The apparatus of claim 1, wherein the die includes a processor.

8. The apparatus of claim 1 wherein the conductive structure comprises copper.

9. The apparatus of claim 1, wherein the phase change material comprises TH58.

* * * * *

UNITED STATES PATENT AND TRADEMARK OFFICE
CERTIFICATE OF CORRECTION

PATENT NO.        : 6,672,370 B2  
APPLICATION NO. : 09/525173  
DATED              : January 6, 2004  
INVENTOR(S)      : Searls et al.

It is certified that error appears in the above-identified patent and that said Letters Patent is hereby corrected as shown below:

On the Title Page, in "Assistant Examiner", in column 2, line 1, delete "Doung" and insert -- Duong --, therefor.

In column 6, line 52, in Claim 5, delete "SiO2" and insert -- $SiO_2$ --, therefor.

In column 6, line 53, in Claim 6, delete "claiom 1" and insert -- claim 1 --, therefor.

In column 6, line 58, in Claim 8, after "claim 1" insert -- , --.

Signed and Sealed this

Fifteenth Day of January, 2008

JON W. DUDAS  
*Director of the United States Patent and Trademark Office*